United States Patent
Chen et al.

(10) Patent No.: US 11,410,857 B2
(45) Date of Patent: Aug. 9, 2022

(54) WAFER HOLDING PINS AND METHODS OF USING THE SAME

(71) Applicant: Taiwan Semiconductor Manufacturing Co., Ltd., Hsinchu (TW)

(72) Inventors: Chia-Lun Chen, Hsinchu (TW); Ming-Sung Hung, Taichung (TW); Po-Jen Shih, Tainan (TW); Wen-Hung Hsu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 229 days.

(21) Appl. No.: 15/908,394

(22) Filed: Feb. 28, 2018

(65) Prior Publication Data
US 2019/0164786 A1    May 30, 2019

Related U.S. Application Data

(60) Provisional application No. 62/592,971, filed on Nov. 30, 2017.

(51) Int. Cl.
*H01L 21/68* (2006.01)
*H01L 21/67* (2006.01)
*H01L 21/687* (2006.01)
*B08B 3/08* (2006.01)
*B08B 3/04* (2006.01)

(52) U.S. Cl.
CPC ........ *H01L 21/67051* (2013.01); *B08B 3/041* (2013.01); *B08B 3/08* (2013.01); *H01L 21/68721* (2013.01); *H01L 21/68728* (2013.01); *H01L 21/68735* (2013.01)

(58) Field of Classification Search
None
See application file for complete search history.

(56) References Cited

U.S. PATENT DOCUMENTS

| | | | |
|---|---|---|---|
| 2004/0020520 A1* | 2/2004 | Kim | B08B 3/02 134/95.2 |
| 2008/0203636 A1* | 8/2008 | Schenck | B25B 5/003 269/25 |
| 2010/0039747 A1* | 2/2010 | Sansoni | H01L 21/6831 361/234 |

(Continued)

OTHER PUBLICATIONS

"Single Wafer Cleaner SU-3100." *SU-3100 Single Wafer Cleaning System*, Screen SPE USA, LLC, dnse.com/home/products-technology/products/spin-processor/single-wafer-cleaner-su-3100.

*Primary Examiner* — Mikhail Kornakov
*Assistant Examiner* — Ryan L Coleman
(74) *Attorney, Agent, or Firm* — Haynes and Boone, LLP (57) ABSTRACT

An apparatus includes a substrate stage configured to secure a substrate thereon and a motion mechanism configured to rotate the substrate stage. The substrate stage includes a plurality of holding pins for holding an edge of the substrate. Rotating the substrate stage causes a chemical solution dispensed on an upper surface of the substrate to spread outwardly toward the edge of the substrate. At least one of the plurality of holding pins includes at least one opening or at least one tapered side surface, or both, for guiding the chemical solution to flow off the substrate.

20 Claims, 7 Drawing Sheets

(56) References Cited

U.S. PATENT DOCUMENTS

| | | | | |
|---|---|---|---|---|
| 2014/0331927 A1* | 11/2014 | Nakano | ............... | H01L 21/00 118/641 |
| 2016/0096205 A1* | 4/2016 | Kato | ............ | H01L 21/68792 134/21 |
| 2016/0284585 A1* | 9/2016 | Kobayashi | ....... | H01L 21/67742 |

* cited by examiner

WAFER HOLDING PINS AND METHODS OF USING THE SAME

This is a non-provisional application of and claims priority to U.S. Provisional Patent Application Ser. No. 62/592,971, filed Nov. 30, 2017, the entire disclosure of which is hereby incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component that can be created using a fabrication process) has decreased. This scaling down process generally provides benefits by increasing production efficiency and lowering associated costs.

However, such scaling down has also increased the complexity of processing and manufacturing ICs. For example, the scaling down process has placed higher requirements on cleaning a wafer surface, which makes up a significant part of the IC manufacturing process. When cleaning a wafer surface using a chemical, traces of chemical residue may remain on the wafer surface. The chemical residue may prolong drying time, cause defects, and/or lead to low yield in terms of surface area utilization. As scaling down tightens the requirement for surface area utilization, the issue of chemical residue becomes more prominent. Existing semiconductor cleaning equipment and methods do not seem to satisfactorily address this issue. Accordingly, more effective cleaning systems and methods are desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "front," "back" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor cleaning systems and processes, and more particularly related to a wafer chuck and methods of using the same. In an embodiment of the present disclosure, a wafer chuck has a plurality of wafer holding pins distributed thereon, and each wafer holding pin is designed to have geometric features, such as a drainage hole or tapered side surfaces, that facilitate a chemical solution to flow off a silicon wafer held in place by the wafer holding pins. For example, when cleaning a silicon wafer, a liquid dispenser dispenses a cleaning liquid onto an upper surface of the silicon wafer, and spinning the silicon wafer causes the cleaning liquid to spread outwardly toward the wafer bevel and toward the wafer holding pins. A recess area on each wafer holding pin touches the wafer bevel, and the recess area may have one or more drainage holes that help guide the cleaning liquid to flow off the outer edge of the silicon wafer and to pass through the wafer holding pin. Such a chemical drainage mechanism may reduce an amount of chemical residue that remains on the silicon wafer (on both upper and lower surfaces). Accordingly, it takes less time to dry the chemical residual, the potential for defects is reduced or eliminated, and surface area utilization is improved.

Figure 1:
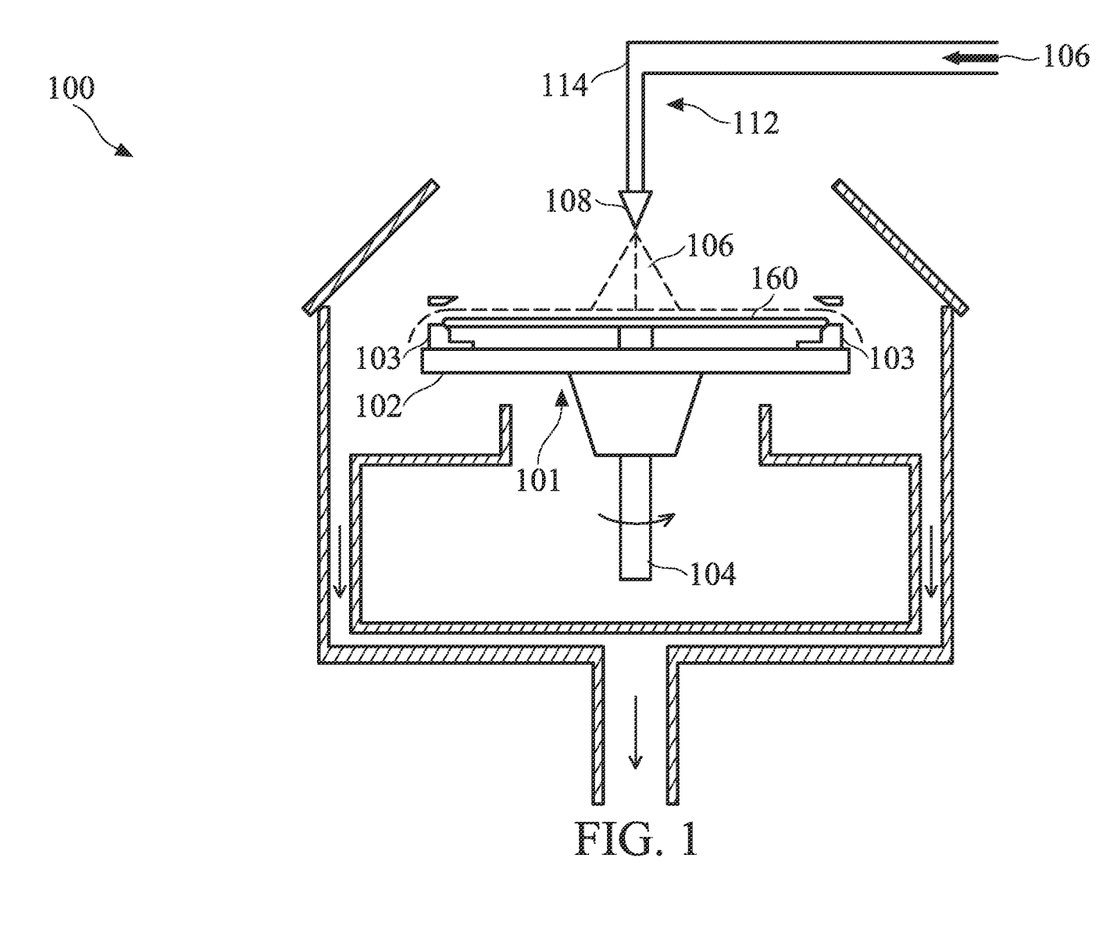
FIG. 1 is a schematic diagram of an embodiment of a semiconductor cleaning system according to aspects of the present disclosure.

FIG. 1 is a schematic diagram of an embodiment of a semiconductor processing system 100 constructed according to aspects of the present disclosure. The semiconductor processing system 100 may be a wafer cleaning system (e.g., a single wafer cleaner or a multi-wafer cleaner), a scrubber, a wet station, or another system for semiconductor processing. As shown in FIG. 1, the semiconductor processing system 100 includes a substrate stage 101 designed to securely retain a substrate 160 to be processed. The substrate stage 101 may be a wafer chuck, a wafer base, or the like. In some embodiments, the substrate stage 101 comprises a base 102 and a plurality of holding pins 103. The base 102 may be configured to support the substrate 160 from below, and the holding pins 103 may be configured to hold an edge of the substrate 160. The substrate stage 101 may include other mechanisms, such as vacuum suction and/or e-chucking, to secure the substrate 160. The substrate stage 101 may include other mechanisms to maneuver the substrate 160, such as controlling the levelness of the substrate 160, vertically moving the substrate 160, rotating the substrate 160, and flipping the substrate 160.

The holding pins 103 (sometimes referred to as wafer clamps, wafer holding pins, or the like) may comprise geometric features, such as drainage holes or tapered side surfaces, which facilitate draining chemicals off the substrate 160. The holding pins 103 are discussed in more details below after an overview of the semiconductor processing system 100.

The substrate 160 may be bare or may be covered with one or more additional material layers on its upper surface. In some embodiments, the substrate 160 is a semiconductor wafer, such as a silicon wafer. The substrate 160 may also be a wafer having other semiconductor material, such as silicon germanium layer epitaxy grown on a silicon wafer or a compound semiconductor layer epitaxy grown on a sapphire wafer. In some embodiments, the substrate 160 may include one or more other suitable substrates. The substrate stage 101 is operable to spin such that the substrate 160 secured thereon is spun accordingly.

The semiconductor processing system 100 may further include a motion mechanism 104 coupled to or integrated within the substrate stage 101. The motion mechanism 104 is operable to drive the substrate stage 101 and the substrate 160 secured thereon in various motion modes. For example, the motion mechanism 104 may include a motor to drive the substrate stage 101 and the substrate 160 to spin at appropriate spin speeds during various operations (such as coating and rinsing). In some embodiments, the motion mechanism 104 includes an elevation module to move the substrate 160 along a vertical direction so that the substrate 160 is able to be positioned at a lower or higher level.

The semiconductor processing system 100 may further include a liquid dispenser 112 for processing (e.g., cleaning) the substrate 160. In some embodiments, a chemical solution 106 is dispensed through a nozzle 108 over the substrate 160 while it is spun. The chemical solution 106 may be delivered to the nozzle 108 through a pipeline 114. In examples, a pressurized gas, such as nitrogen, may be introduced into a container to force the chemical solution 106 out of the container and into the liquid dispenser 112. The chemical solution 106 may comprise any wet chemical, fluid, or liquid needed for processing the substrate 160. For example, the chemical solution 106 may be a cleaning liquid such as deionized water (DIW), acetone, methanol, ammonium hydroxide, hydrogen peroxide, hydrofluoric acid, a photoresist, a silicon-containing material, another solution, or combinations thereof.

Figure 2A:
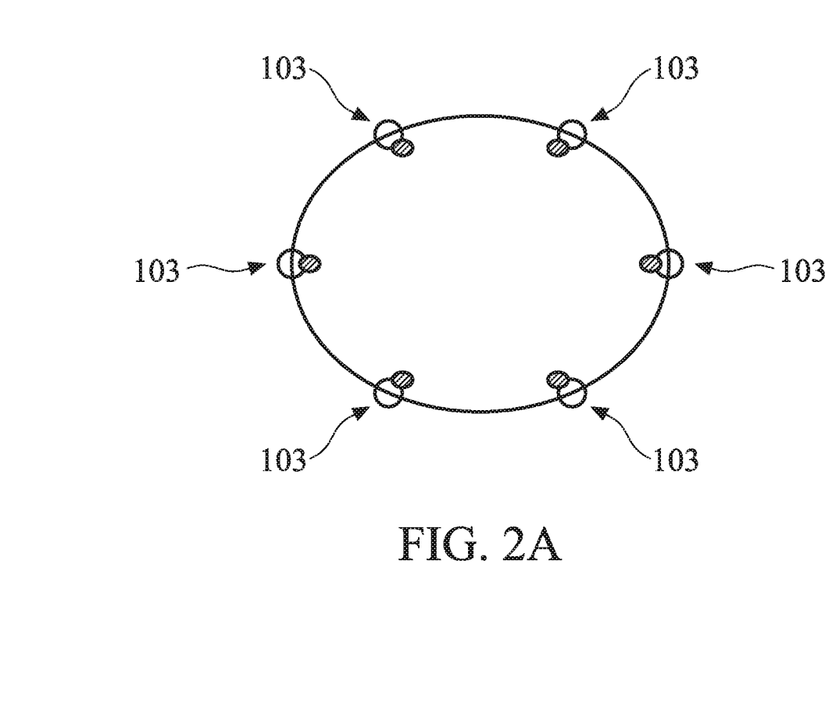
FIG. 2A is a plan view of a plurality of holding pins distributed on a substrate stage, in accordance with an embodiment.

Referring back to the holding pins 103, which are illustrated in FIG. 2A, they may be distributed on the substrate stage 101. FIG. 2A shows six holding pins 103 evenly distributed along an edge of the base 102, where each holding pin is separated by 60 degrees in a radial direction. It should be appreciated that any other suitable number of holding pins 103 (e.g., four, five, eight) may be mounted on the substrate stage 101. In an example, the base 102 of the substrate stage 101 may be made of polyvinyl chloride (PVC) or any other suitable material(s) that can tolerate high temperature and strong acidic or alkaline solutions, since the base 102 may be exposed to such conditions. The holding pins 103 of the substrate stage 101 may be made of any suitable material(s) (e.g., a polymer) that can tolerate high temperature and strong acidic or alkaline solutions since the holding pins 103 may be exposed to such conditions. In addition, the material(s) for the holding pins 103 may be tolerant to high stresses caused by surface contact with the substrate 160 during high speed spinning operations.

Figure 2B:
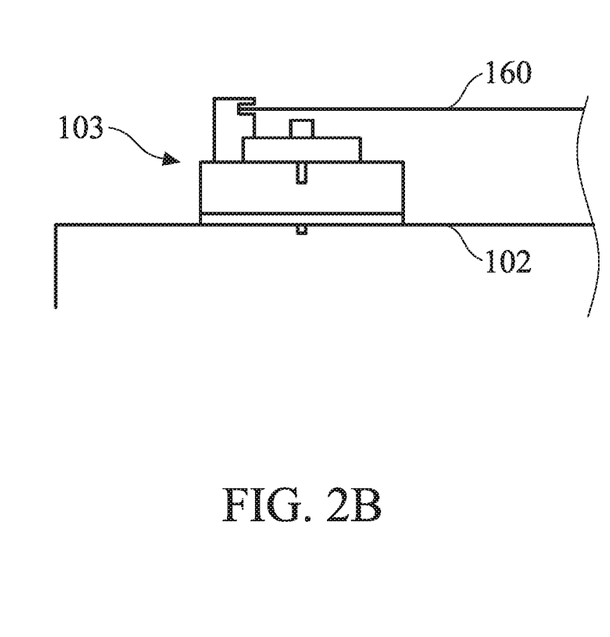
FIG. 2B is a schematic diagram of a holding pin in operation, in accordance with an embodiment.

FIG. 2B illustrates an example holding pin 103 disposed on the base 102 of the substrate stage 101. The substrate 160 may be placed onto the substrate stage 101 manually (i.e., by hand) or by an automatic means (e.g., robot arms). It should be understood that the holding pins 103 may be in any arrangement on the substrate stage 101 as long as they are able to properly secure the substrate 160. The holding pins 103 are designed to collectively hold an outer edge of the substrate 160 to prevent the substrate 160 from moving undesirably (e.g., getting loose or flying off the substrate stage 101 during spinning).

Figure 3A:
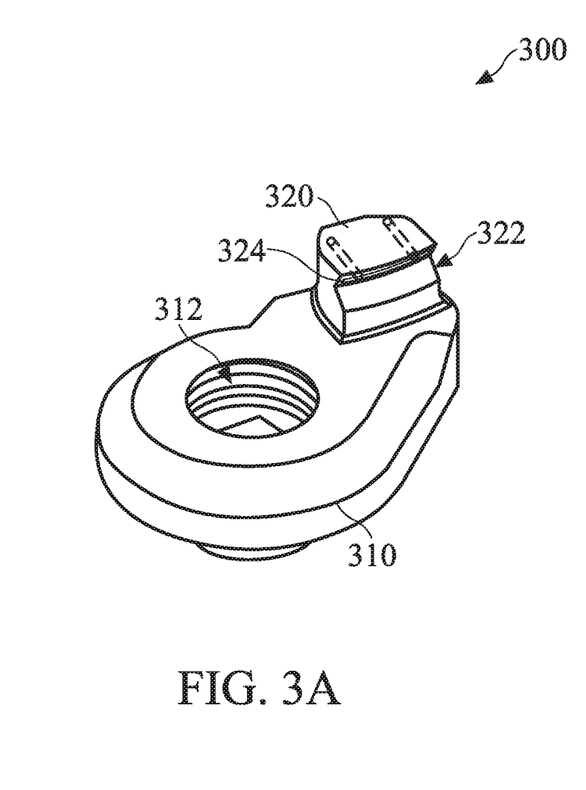
FIG. 3A is a perspective view of an embodiment of a holding pin.
Figure 3B:
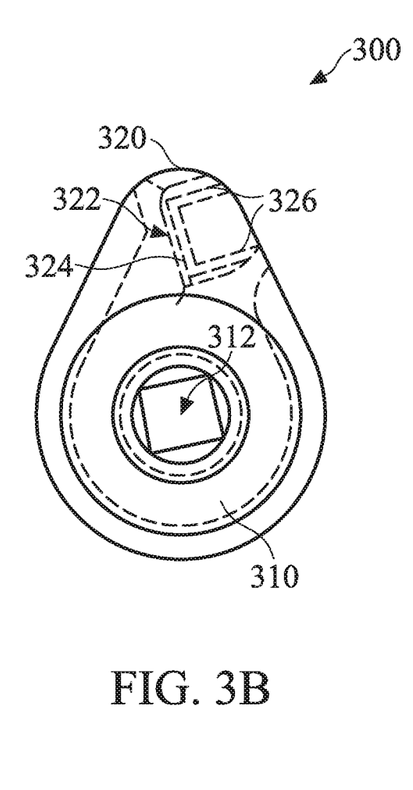
FIG. 3B is a plan view of the holding pin in FIG. 3A.

The holding pins 103 disclosed herein may take various physical forms. For instance, FIG. 3A is a perspective view of an example holding pin 300, and FIG. 3B is a plan view of the same holding pin 300. The holding pin 300 includes a base section 310 and a clamp section 320. The base section 310 may include features to facilitate its mounting on the base 102 of the substrate stage 101. For example, in the embodiment shown in FIGS. 3A and 3B, the base section 310 includes a vertical hole 312 whose upper portion is a threaded cylinder and whose lower portion is a square opening with smooth walls. The base 102 may have features that work in concert with the vertical hole 312 in order to secure the holding pin 300. For example, a metal bolt of suitable size may be inserted into the vertical hole 312 and into a corresponding hole in the base 102. Although not shown in FIG. 3A, a cover may be placed in the vertical hole 312 over the metal bolt.

As shown in FIGS. 3A and 3B, the clamp section 320 protrudes upward from the base section 310 and is designed to physically hold the outer edge or bevel of the substrate 160. The clamp section 320 has a front surface 322 that faces the substrate 160 during use. In the embodiment shown in FIGS. 3A and 3B, the front surface 322 is concave so as to form a recess area 324 with a generally horizontal crease, groove, or cut line. The deepest (or most concaved) part of the recess area 324 is configured to fit the outer edge of the substrate 160. As a result, the recess area 324 helps prevent the substrate 160 from slipping vertically, thereby providing a better grip on the substrate 160. In some embodiments, the front surface 322 may also be curved inwardly with a radius similar to that of the substrate 160 so that the front surface 322 and the substrate 160 can be concentric. Such a circumferential curvature of the front surface 322 increases a contact area with the substrate 160, which improves stability (e.g., when multiple holding pins 103 holding the substrate 160 are concentric with the substrate 160). In alternative embodiments not shown in FIGS. 3A and 3B, the front surface 322 may be flat in the horizontal direction, the vertical direction, or both.

Figure 3C:
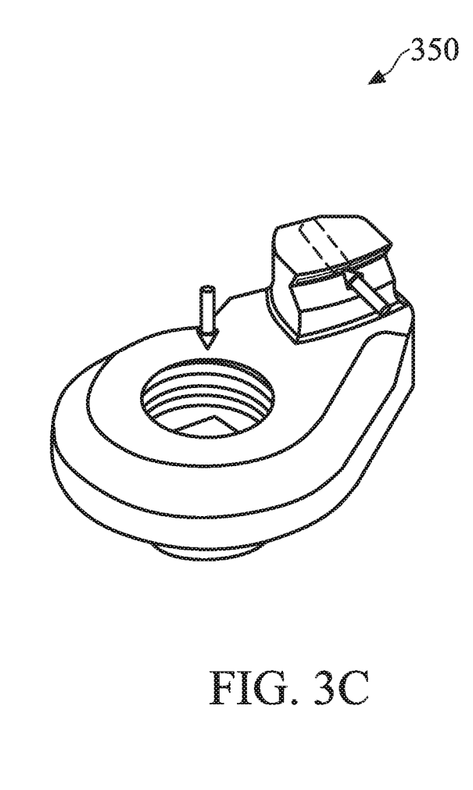
FIG. 3C is a perspective view of another embodiment of a holding pin.

As shown in FIGS. 3A and 3B, the recess area 324 of the holding pin 300 includes two openings 326. The openings 326 may reside at the deepest part of the recess area 324 (e.g., intersecting a crease, groove, or cut line in the recess area 324). The openings 326 may penetrate through a body of the holding pin 300, extending from the front surface 322 to another surface (e.g., a back surface or a bottom surface). In other words, a front end of each opening 326 may be on the front surface 322, while a back end of each opening 326 may be on the back surface or the bottom surface. Although FIGS. 3A and 3B illustrate two openings 326, any other suitable number of openings may be used. For example, FIG. 3C shows a holding pin 350, which has a single opening, but is otherwise similar to the holding pin 300 (see also FIGS. 4A-4F discussed below).

Figure 3D:
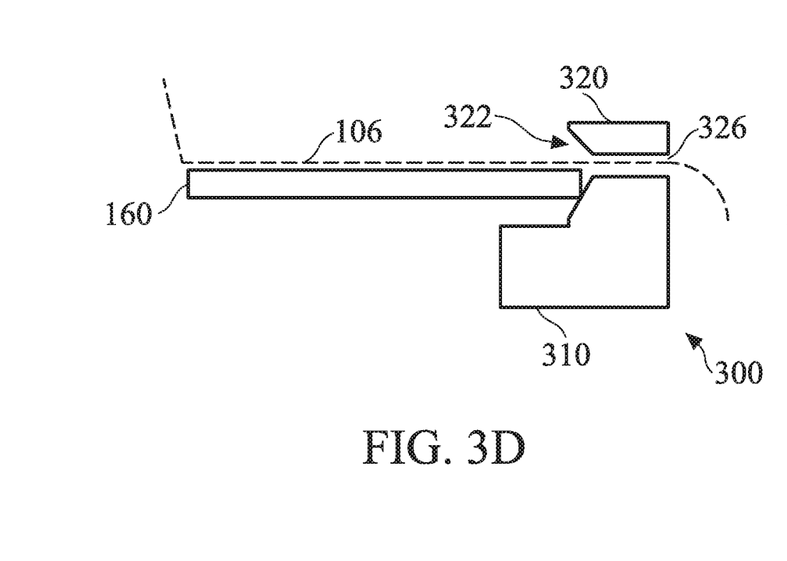
FIG. 3D is a simplified block diagram of an embodiment of a chemical drainage mechanism.

FIG. 3D illustrates an embodiment of a chemical drainage mechanism using the holding pin 300. As shown, the front surface 322 is concave. Each opening 326 may serve as a drainage hole that permits the chemical solution 106 to flow off the substrate 160 and through the holding pin 300. For example, when the substrate 160 is being cleaned, spinning the substrate 160 drives the chemical solution 106 to spread from an inner region of the substrate 160 toward its outer edge. The opening 326 may guide the chemical solution 106 to flow off the outer edge of the substrate 160, then through the openings 326, and eventually off the back side of the holding pin 300. In use, only a portion of the chemical solution 106 spin coated on the substrate 160 needs to go through drainage holes on the holding pin 300, since some of the chemical solution 106 is spun off the substrate 160 without coming into contact with the holding pin 300.

The chemical drainage mechanism shown in FIG. 3D may bring about various advantages by reducing an amount of chemical residue on the substrate 160 (on both upper and lower surfaces). For example, if there were no chemical drainage mechanism on the holding pin 300 (e.g., no opening 326), back splashes would occur when the chemical solution 106 is being spun off the upper surface of the substrate 160 (i.e., the chemical solution 106 is bounced back by the front surface of the holding pin 300). Such back splashes may leave chemical residues around the edge of the upper and/or lower surfaces of the substrate 160, which may be difficult to remove by automatic drying or even by manual cleaning (e.g., certain chemical solutions or contents therein may solidify during drying to form stains at certain spots that tend to stick to the substrate 160). The opening 326 solves this problem by reducing the amount of the chemical solution 106 that gets bounced or splashed back by the front surface of the holding pin 300. Therefore, an amount of chemical residue caused by back splash may be reduced or eliminated. Consequently, it may take less time to dry the chemical residue. The front surface 322 may be exposed to less stress caused by pounding of the chemical solution 106. The potential for defects in subsequent processes of the substrate 160 is also reduced or eliminated. Further, due to reduced defects on the upper surface of the substrate 160, surface area utilization may be improved.

Figure 3E:
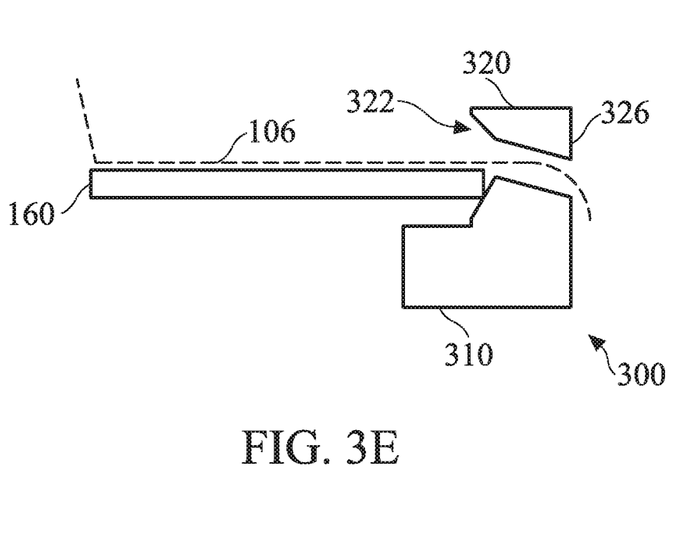
FIG. 3E is a simplified block diagram of another embodiment of a chemical drainage mechanism.

In terms of vertical position, in some embodiments, the opening 326 may be positioned at least partially above the substrate 160. As shown in FIG. 3D, the opening 326 intersects the edge of the substrate 160. Such a vertical position helps the chemical solution 106 to enter the opening 326 from the edge of the substrate 160. As FIG. 3D shows, the opening 326 may be a level channel or hole. However, as FIG. 3E illustrates, the opening 326 may alternatively be tilted. For example, the opening 326 may be tilted such that the front end of the opening 326 is above the back end of the opening 326. Such a downward tilt creates a gravity pull for the chemical solution 160 to naturally flow off the outer edge of the substrate 160, through the opening 326, and eventually off the holding pin 300. Depending on factors such as the size of the opening 326, the degree of tilt for the opening 326 may be controlled so as to avoid back splash or impedance of chemical flow.

FIG. 3D shows the opening 326 as having a constant cross-sectional diameter for the length of the holding pin 300. In alternative embodiments, the cross-sectional diameter of the opening 326 may change. For example, the opening 326 may have a front end that is larger than its back end, or vice versa.

Figure 4A:
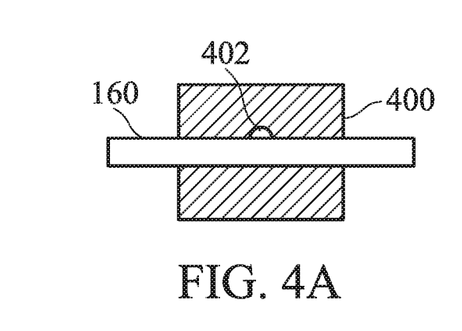
FIG. 4A is a cross-sectional view (in a vertical direction) of yet another embodiment of a holding pin with a single opening.
Figure 4B:
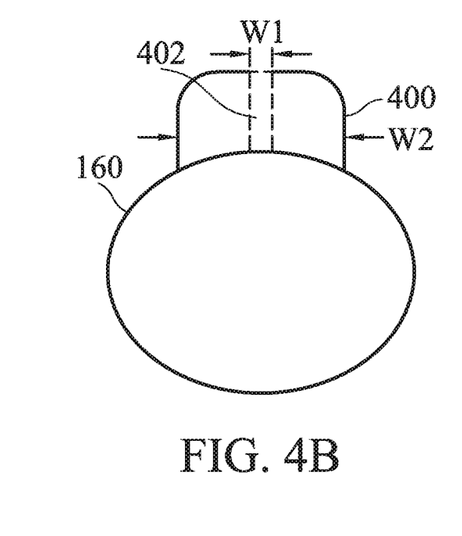
FIG. 4B is a cross-sectional plan view (horizontal direction) of the holding pin in FIG. 4A.

As further illustrated in FIGS. 4A-4G, the chemical drainage mechanisms disclosed herein may be flexibly constructed. For example, instead of having two openings 326 as shown in FIG. 3A-3B, FIGS. 4A and 4B illustrate a holding pin 400 with a single opening 402. As shown in FIG. 4A, the opening 402 is a cylinder, but it can take other shapes if needed. In terms of horizontal position, the opening 402 may sit at about the middle of the holding pin 400. In terms of vertical position, the opening 402 sits partly above the upper surface of the substrate 160 and partly between the upper and lower surfaces of the substrate 160. As shown in FIG. 4B, the opening 402 runs through the body of the holding pin 400 between its front and back surfaces. In terms of size, the opening 402 has a relatively small diameter. In some embodiments, to make sure that a chemical solution can smoothly flow through the opening 402, the diameter of the opening 402 may not be too small. For example, suppose that the front end of the opening 402 has a first width W1 in a plan view (e.g., a diameter when the front end is a circle), and the front surface of the holding pin 400 has a second width W2 in the plan view, in some embodiments W1 is no less than 10% of W2. Depending on factors such as the material makeup of the holding pin 400, this lower limit may be flexibly adapted to other numbers such as 15%, 20%, 30%, 40%, etc.

Figure 4C:
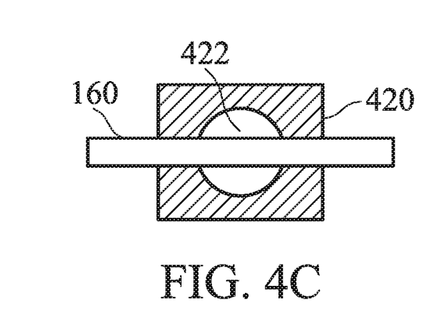
FIG. 4C is a cross-sectional view (in a vertical direction) of yet another embodiment of a holding pin with a single, larger opening.
Figure 4D:
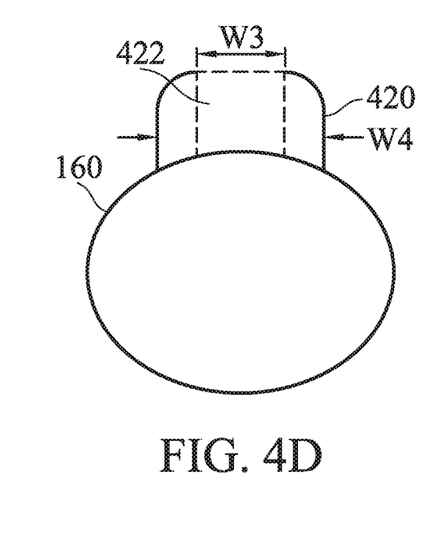
FIG. 4D is a cross-sectional plan view (horizontal direction) of the holding pin in FIG. 4C.

FIGS. 4C and 4D illustrate a holding pin 420 also with a single opening 422, but the opening 422 has a larger diameter than the opening 402. In some embodiments, to make sure that the structural integrity of the holding pin 420 is not compromised by the opening 422, the diameter of the opening 422 may not be too big. For example, suppose that the front end of the opening 422 has a first width W3 in a plan view (e.g., a diameter when the front end is a circle), and the front surface of the holding pin 420 has a second width W4 in the plan view, in some embodiments the W3 is no greater than 50% of W4. Depending on factors such as the material makeup of the holding pin 420, this upper limit may be flexibly adapted to other numbers such as 30%, 35%, 40%, 45%, 48%, etc.

As shown in FIG. 4C, due to its relatively large size, the opening 422 sits partly above the upper surface of the substrate 160 and partly below the lower surface of the substrate 160. In other words, the front end of the opening 422 has a top point situated above the substrate 160 and a bottom point situated below the lower surface of the substrate 160. Having a sufficiently large opening may help guide the chemical solution 106 off both sides of the substrate 160. In some embodiments, the front end of the opening 422 has a height that is equal to or greater than a thickness of the substrate 160. In some embodiments, the front end of the opening 422 is a circle whose diameter is equal to or greater than 1.5 times the thickness of the substrate 160. Having a front end bigger than the thickness of the substrate 160 may help prevent the substrate 160 from undesirably blocking the entrance to the opening 422 (e.g., if there is chemical residue on the lower surface of the substrate 160, which may raise its vertical position). Depending on various factors (e.g., different spin speeds, different chemical solutions, different vertical position of the opening 422), such a ratio may change (e.g., 1 time, 2 times, 2.5 times, or 3 times). On the other hand, to maintain the structural integrity of the holding pin 420, the diameter of the opening 422 may be limited to a certain extent (e.g., 50% of the width of the front surface of the holding pin 420). If the diameter of the opening 422 is too big, the holding pin 420 may not be able to handle the high stress created by surface contact with the substrate 160 at high spinning speeds, which may even cause the holing pin 420 to crack, for example, on its front surface near the opening 422. As shown in FIG. 4D, the opening 422 runs through the body of the holding pin 420 between its front and back surfaces.

Figure 4E:
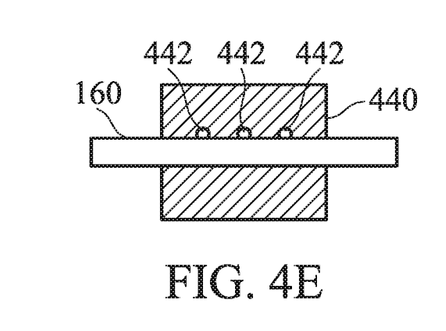
FIG. 4E is a cross-sectional view (in a vertical direction) of yet another embodiment of a holding pin with three openings.
Figure 4F:
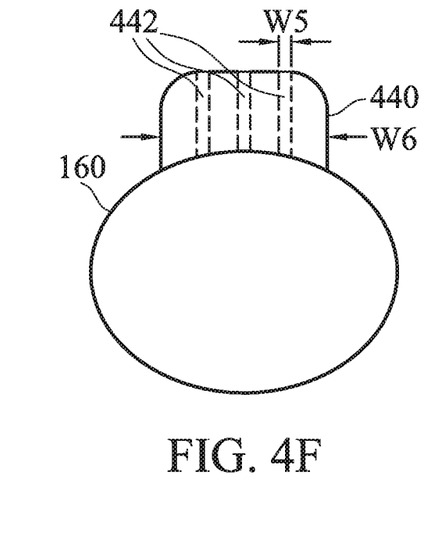
FIG. 4F is a cross-sectional plan view (horizontal direction) of the holding pin in FIG. 4E.

FIGS. 4E and 4F illustrate a holding pin 440 with three openings 442. As shown in FIG. 4E, the openings 442 may sit partly above the upper surface of the substrate 160. In other words, the front end of each opening 442 has a bottom point that may be slightly below the upper surface of the substrate 160. Alternatively, the front end of each opening 442 may sit just above the upper surface of the substrate 160 (i.e., the front end has a bottom point at about the same level as the upper surface of the substrate 160).

As shown in FIG. 4F, the openings 442 run through the body of the holding pin 440 between its front and back surfaces. In terms of size, because there are more openings 422, each opening 442 has a relatively small diameter, but to make sure that a chemical solution can smoothly flow through each opening 442, the diameter of the opening 442 may not be too small. For example, suppose that the front end of each opening 442 has a first width W5 in a plan view (e.g., diameter), and the front surface of the holding pin 440 has a second width W6 in the plan view, in some embodiments W5 is no less than 10% of W6. In some embodiments, a combined width of all front ends of the openings 442 (e.g., 3×W5) is equal to or greater than 10% of W6. Depending on factors such as the material makeup of the holding pin 440, this lower limit may be flexibly adapted to other numbers such as 15%, 20%, etc. Moreover, to make sure that the structural integrity of the holding pin 440 is not compromised by the openings 442, the diameter of each opening 442 may not be too big. In some embodiments, W5 is no greater than 20% of W6. In other embodiments, a combined width of all front ends of the openings 442 is equal to or less than 50% of W6. Depending on factors such as the material makeup of the holding pin 440, this upper limit may be flexibly adapted to other numbers such as 20%, 30%, 40%, 45%, etc.

Figure 4G:
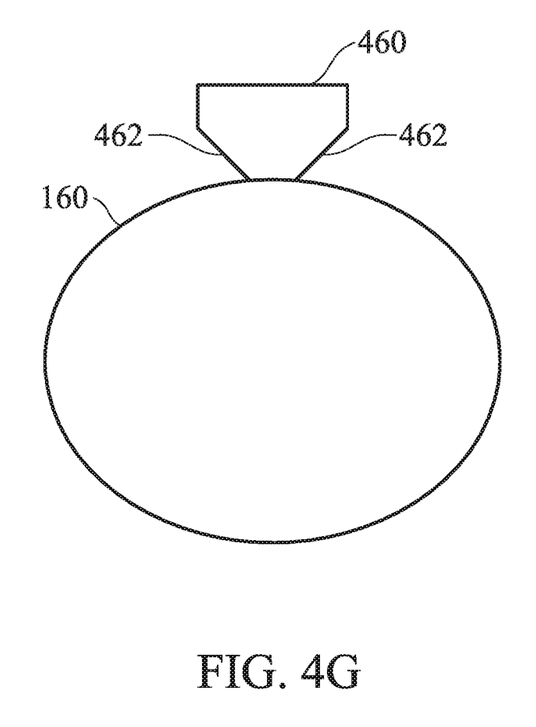
FIG. 4G is a cross-sectional plan view (horizontal direction) of yet another embodiment of a holding pin that includes two tapered side surfaces.

In addition to using drainage holes to realize chemical drainage, a holding pin disclosed herein may use other geometric features for guiding a chemical solution to flow off silicon wafers. For instance, FIG. 4G illustrates a holding pin 460 that includes two sloped or tapered side surfaces 462, both intersecting its front surface. Although FIG. 4G illustrates two tapered side surfaces 462, the holding pin 460 may alternatively have one tapered side surface or may have other surface features to drain the chemical solution 106 from both sides of the substrate 160. The tapered side surfaces 462 are shown as symmetrical on both sides of the holding pin, but they may be asymmetrical if needed.

Each tapered side surface 462 narrows the front surface of the holding pin 460, which reduces chemical back splash and facilitates draining. To maximize the draining effect, the front surface of the holding pin 460 may be tapered to a non-trivial extent. Suppose that, in a plan view, the front surface of the holding pin 460 has a natural width had there been no tapered side surface (e.g., equaling a back surface width of the holding pin 460, as shown in FIG. 4G). In some embodiments, each tapered side surface 462 cuts a width of the front surface by at least 20% compared to the natural width. In other embodiments, the two tapered side surfaces 462 may collectively cut the width of the front surface by at least 20% compared to the natural width. On the other hand, to maintain the structural integrity of the holding pin 460 and to ensure secure holding of the substrate 160 during processing, a certain percentage of the front surface needs to be kept. In some embodiments, the two tapered side surfaces 462 collectively may not cut more than 50% of the natural width. Further, it is to be appreciated that both the lower and upper limits of the tapering effects may vary depending on implementation. For example, one or more tapered side surfaces on the holding pin 460 may cut a width of its front surface by no less than 30% but no more than 60%. Note that the extent of tapering also impacts at what point the tapered side surfaces 462 intersect the sides (or the back) of the holding pin 460. For example, in some embodiments, the entire side surfaces of the holding pin 460 may be tapered.

Although not exhaustively illustrated in figures, it should be appreciated that other configurations of the chemical drainage mechanisms are within the working principles disclosed herein. For example, an opening may have any shape suitable for chemical drainage. Instead of being a circle, the front end of an opening may be oval, square, rectangular, curvilinear, or polygonal in shape. If there are multiple openings on a holding pin, each opening may have a different cross-sectional size. Multiple openings may or may not horizontally align with one another. Some openings may reside above (e.g., on top of) or below (e.g., directly underneath) other openings. In the case of a holding pin having one or more tapered side surfaces, the tapered side surfaces may be flat or curved, and may comprise additional features such as grooves or channels that can facilitate chemical flow.

The holding pins disclosed herein may be manufactured or fabricated using any suitable materials, equipment, methods, and processes. For example, an opening may be created by molding or by drilling the body of a holding pin. A tapered side surface may be created by molding or by cutting the surfaces of a holding pin.

Figure 5:
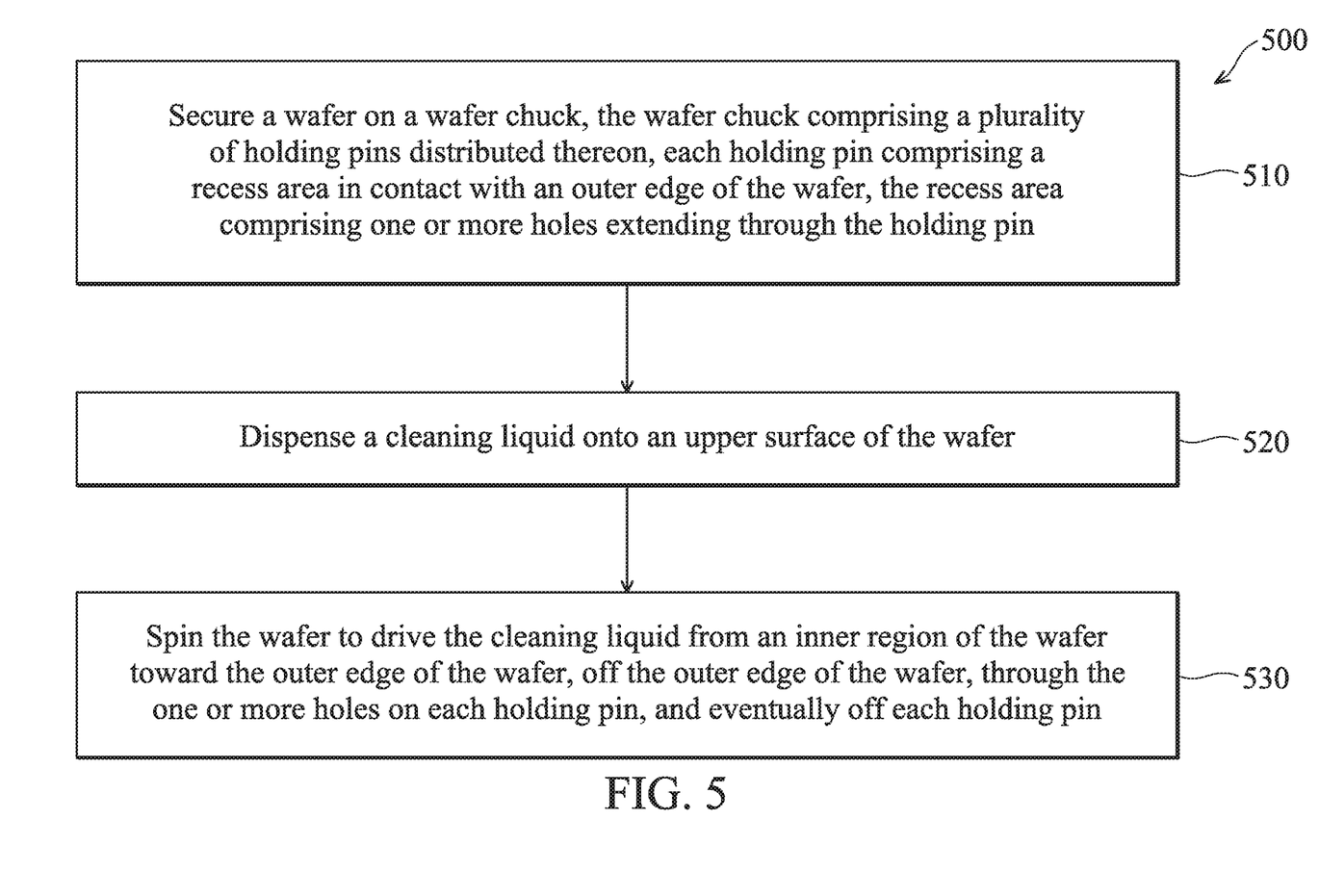
FIG. 5 is a flow chart of a wafer cleaning method according to various aspects of the present disclosure.

FIG. 5 is a flow chart of a wafer cleaning method 500 according to various aspects of the present disclosure. Embodiments of the method 500 may be implemented by a semiconductor processing system (e.g., system 100). The method 500 is an example, and is not intended to limit the present disclosure beyond what is explicitly recited in the claims. Additional operations can be provided before, during, and after the method 500, and some operations described can be replaced, eliminated, or relocated for additional embodiments of the method. Although the system 100 and the method 500 are discussed in the context of cleaning, the chemical drainage mechanisms disclosed herein may also apply to other processes in semiconductor fabrication.

At operation 510, the method 500 secures a wafer (e.g., the substrate 160) on a wafer chuck (e.g., the substrate stage 101). The wafer chuck comprises a plurality of holding pins (e.g., the holding pins 103, 300, 400, 420, 440, and 460) distributed thereon. Each holding pin may have a recess area touching an outer edge of the wafer through a wafer contact location. The recess area comprises one or more holes extending through the holding pin. In an embodiment, the one or more holes includes a first hole with a front end and a back end, where the front end of the first hole intersects the outer edge of the wafer and has a first width in a plan view, where the recess area has a second width in the plan view, and where the first width is between 10% and 50% of the second width. In some embodiments, the substrate stage 101 with holding pins 103 (e.g., shown in FIG. 1) may be utilized by operation 510. Moreover, in other embodiments (e.g., as shown in FIG. 4G), instead of a recess area, each holding pin may have two tapered side surfaces intersecting a narrowed front surface, which contacts the outer edge of the wafer.

Next, in operation 520, a cleaning liquid may be dispensed onto an upper surface of the wafer. In some embodiments, the cleaning liquid may be the chemical solution 106, e.g., as shown in FIG. 1. The cleaning liquid may comprise deionized water (DIW), acetone, methanol, ammonium hydroxide, hydrogen peroxide, hydrofluoric acid, and combinations thereof.

In operation 530, the wafer may be spun to drive the cleaning liquid from an inner region of the wafer toward the outer edge of the wafer, then off the outer edge of the wafer, then through the one or more holes on each holding pin, and eventually off each holding pin. In some embodiments, the one or more holes may be tilted downward on a holding pin for facilitating the cleaning liquid to flow off the outer edge of the wafer, then through the holes, and eventually off the holding pin.

Although not intended to be limiting, as discussed above one or more embodiments of the present disclosure provide many benefits. For example, the chemical drainage mechanisms disclosed herein may reduce an amount of chemical residue that remains on a silicon wafer (on both upper and lower surfaces). Accordingly, it takes less time to dry the chemical residual, the holding pin experiences less stress, the potential for defects is reduced or eliminated, and surface area utilization is improved.

In one exemplary aspect, the present disclosure is directed to an apparatus including a substrate stage configured to secure a substrate thereon, and a motion mechanism configured to rotate the substrate stage. The substrate stage includes a plurality of holding pins for holding an edge of the substrate. At least one of the plurality of holding pins includes at least one opening or at least one tapered side surface, or both, for guiding a chemical solution spread on an upper surface of the substrate to flow off the substrate. In an embodiment, each of the plurality of holding pins includes at least one opening. In an embodiment, the at least one opening present on a first holding pin includes a first opening. The first opening has a front end and a back end. The front end of the first opening guides the chemical solution to flow from the edge of the substrate toward the back end of the first opening, and the front end of the first opening is provided partially above the substrate. In an embodiment, the front end of the first opening is located on a front surface of the first holding pin and has a first width in a plan view, and the front surface has a second width in the plan view. The first width is no less than 10% of the second width. In an embodiment, the first width is no greater than 50% of the second width. In an embodiment, the front end of the first opening has a height that is equal to or greater than a thickness of the substrate. In an embodiment, the front end of the first opening is a circle whose diameter is greater than 1.5 times the thickness of the substrate. In an embodiment, the first opening is tilted on the first holding pin such that the front end of the first opening is above a back end of the first opening. In an embodiment, the at least one opening present on a first holding pin includes a plurality of openings each with its respective front end located on a front surface of the first holding pin. A combined width of all front ends of the plurality of openings in a plan view is between 10% and 50% of a width of the front surface in the plan view. In an embodiment, each of the plurality of holding pins comprises a front surface facing the edge of the substrate, and each of the plurality of holding pins comprises at least one tapered side surface that intersects the respective front surface of the holding pin. In an embodiment, the at least one tapered side surface cuts a width of the front surface in a plan view by at least 20% compared to a natural width of the front surface in the plan view without the at least one tapered side surface.

In another exemplary aspect, the present disclosure is directed to a wafer cleaning system including a wafer chuck configured to secure a silicon wafer thereon, a liquid dispenser configured to dispense a cleaning liquid onto an upper surface of the silicon wafer, and a spinning mechanism configured to spread the cleaning liquid outwardly from the silicon wafer by spinning the wafer chuck. The wafer chuck includes a plurality of wafer clamps distributed thereon. Each of the wafer clamps includes a recess area configured to touch an outer edge of the silicon wafer. The recess area on each of the wafer clamps includes at least one drainage hole for permitting the cleaning liquid to flow off the outer edge of the silicon wafer and to pass through the wafer clamp. In an embodiment, the at least one drainage hole located in the recess area of a first wafer clamp includes a first hole with a front end and a back end. The front end of the first hole permits the cleaning liquid to flow from the outer edge of the silicon wafer and through the first hole. In an embodiment, the front end of the first hole has a first width in a plan view, and the recess area has a second width in the plan view. The first width is between 10% and 50% of the second width. In an embodiment, the first hole is located in a deepest part of the recess area of the first wafer clamp, and the front end of the first hole physically intersects the upper surface of the silicon wafer. In an embodiment, the first hole is tilted on the first wafer clamp such that the front end of the first hole is above a back end of the first hole. In an embodiment, each wafer clamp further comprises a base section situated below the recess area of the wafer clamp and secured on the wafer chuck.

In yet another exemplary aspect, the present disclosure is directed to a method for cleaning a wafer, comprising: securing the wafer on a wafer chuck, the wafer chuck comprising a plurality of holding pins distributed thereon, each holding pin comprising a recess area in contact with an outer edge of the wafer, the recess area comprising one or more holes extending through the holding pin; dispensing a cleaning liquid onto an upper surface of the wafer; and spinning the wafer to drive the cleaning liquid from an inner region of the wafer toward the outer edge of the wafer, off the outer edge of the wafer, through the one or more holes on each holding pin, and eventually off each holding pin. In an embodiment, the one or more holes located in the recess area of a first holding pin includes a first hole with a front end and a back end. The front end of the first hole intersects the outer edge of the wafer and has a first width in a plan view, and the recess area has a second width in the plan view. The first width is between 10% and 50% of the second width. In an embodiment, the first hole is tilted downward on the first holding pin for facilitating the draining of the cleaning liquid.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus, comprising:
a substrate stage configured to secure a substrate thereon, the substrate stage comprising a supporting base and four, five, six, or eight holding pins evenly distributed along and on an entire circumferential edge of the supporting base for holding an edge of the substrate, wherein the supporting base comprises four, five, six, or eight retaining holes, each retaining hole of the four, five, six, or eight retaining holes is used for retaining a corresponding first portion of a respective threaded bolt of four, five, six, or eight threaded bolts; and
a motion mechanism configured to rotate the substrate stage,
wherein each holding pin of the four, five, six, or eight holding pins is a one-piece structure that is fixed to the supporting base via the respective threaded bolt of the four, five, six, or eight threaded bolts and comprises a base section and a clamp section protruding therefrom, wherein each base section and its respective protruding clamp section are non-movable with respect to each other, wherein each clamp section includes a concave front surface and a first opening formed therein for guiding a chemical solution spread on an upper surface of the substrate to flow off the substrate, wherein each first opening has a front end and a back end, and wherein each front end guides the chemical solution to flow from the edge of the substrate toward the back end of a respective first opening, wherein each front end is larger than the back end of the respective first opening,
wherein each base section comprises a vertical holes for retaining a corresponding second portion of the respective threaded bolt of the four, five, six, or eight threaded bolts, wherein each vertical hole comprises a threaded upper portion and a non-threaded lower portion, a shape of a plan view of each threaded upper portion comprises a round shape and a shape of a plan view of each non-threaded lower portion comprises a square shape.

2. The apparatus of claim 1, wherein each of the four, five, six, or eight holding pins comprises at least one opening.

3. The apparatus of claim 1, wherein each front end has an upper portion above the substrate and a bottom portion blocked by the substrate horizontally.

4. The apparatus of claim 3, wherein each front end is located on its respective concave front surface and has a first width in a plan view, wherein each concave front surface has a second width in the plan view, and wherein each first width is no less than 10% of the second width of its respective concave front surface.

5. The apparatus of claim 4, wherein each first width is no greater than 50% of the second width of its respective concave front surface.

6. The apparatus of claim 3, wherein each front end has a height that is equal to or greater than a thickness of the substrate.

7. The apparatus of claim 6, wherein each front end is a circle whose diameter is greater than 1.5 times the thickness of the substrate.

8. The apparatus of claim 3, wherein each first opening is tilted on its respective holding pin of the four, five, six, or eight holding pins such that the front end of each first opening is above the back end of the respective first opening.

9. The apparatus of claim 1, wherein each holding pin includes a plurality of openings each with its respective front end located on the concave front surface of its respective holding pin of the four, five, six, or eight holding pins, and wherein a combined width of all front ends of the plurality of openings of the respective holding pin in a plan view is between 10% and 50% of a width of the concave front surface of the respective holding pin in the plan view.

10. The apparatus of claim 1, wherein each holding pin of the four, five, six, or eight holding pins comprises at least one tapered side surface that intersects the concave front surface of its respective holding pin.

11. The apparatus of claim 10, wherein each tapered side surface cuts a width of the concave front surface of the respective holding pin in a plan view by at least 20% compared to a natural width of the concave front surface of the respective holding pin in the plan view without the at least one tapered side surface.

12. A wafer cleaning system, comprising:
a wafer chuck configured to secure a silicon wafer thereon, the wafer chuck comprising a supporting base and six integral wafer clamps distributed on the supporting base wherein each integral wafer clamp and its neighboring integral wafer clamps are positioned 60° apart, wherein each integral wafer clamp of the six integral wafer clamps is fixed to the supporting base via a respective threaded bolt and comprises a base section and a clamp section protruding therefrom, wherein each clamp section has a recess area configured to touch an outer edge of the silicon wafer, and wherein each base section and its respective protruding clamp section are non-movable with respect to each other;
a liquid dispenser configured to dispense a cleaning liquid onto an upper surface of the silicon wafer; and
a spinning mechanism configured to spread the cleaning liquid outwardly from the silicon wafer by spinning the wafer chuck,
wherein each integral wafer clamp further comprises a first hole for retaining an upper portion of the respective threaded bolt, wherein the supporting base comprises a corresponding hole for retaining a lower portion of the respective threaded bolt;
wherein each recess area comprises a concave front surface and a first drainage hole formed therein,
wherein each first drainage hole has a front end and a back end, each front end permits the cleaning liquid to flow off the outer edge of the silicon wafer and to pass through a respective integral wafer clamp of the six integral wafer clamps,
wherein each front end has an upper portion above the silicon wafer and a bottom portion blocked by the silicon wafer horizontally, wherein each front end is larger than the back end of its respective first drainage hole.

13. The wafer cleaning system of claim 12, wherein each front end has a first width in a plan view, wherein each recess area has a second width in the plan view, and wherein each first width is between 10% and 50% of the second width of its respective recess area.

14. The wafer cleaning system of claim 12, wherein each first drainage hole is located in a deepest part of its respective recess area, wherein each front end physically intersects the upper surface of the silicon wafer.

15. The wafer cleaning system of claim 12, wherein each first drainage hole is tilted on its respective integral wafer clamp such that each front end is above the back end of its respective first drainage hole.

16. The wafer cleaning system of claim 12, wherein each base section comprises its respective first hole for retaining the upper portion of the respective threaded bolt and is secured on the supporting base through the respective threaded bolt.

17. A wafer cleaning system, comprising:
a wafer chuck configured to secure a wafer thereon, the wafer chuck comprising a supporting base and a plurality of one-piece wafer clamps distributed thereon, wherein each of the plurality of one-piece wafer clamps comprises a base section and a clamp section protruding therefrom, wherein each base section and its respective protruding clamp section are non-movable with respect to each other, wherein each clamp section comprises an upper front face and a lower front face facing each other to thereby form a concave front surface configured to touch an outer edge of the wafer, wherein each base section is fixed to the supporting base through a respective threaded bolt;
a liquid dispenser configured to dispense a cleaning liquid onto an upper surface of the wafer; and
a spinning mechanism configured to spread the cleaning liquid outwardly from the wafer by spinning the wafer chuck,
wherein a first wafer clamp of the plurality of one-piece wafer clamps comprises a drainage hole extending through the body of the first wafer clamp, the drainage hole comprises a front opening formed in the concave front surface of the first wafer clamp and a bottom opening formed in a bottom surface of the first wafer clamp, wherein an upper portion of the front opening of the drainage hole is provided above the upper surface of the wafer when the wafer is secured on the chuck and a remaining portion of the front opening of the draining hole is blocked by the wafer horizontally when the wafer is secured on the chuck, the front opening interfacing with the wafer and permitting the cleaning liquid to flow off the outer edge of the wafer and to pass through the drainage hole out of the bottom opening.

18. The wafer cleaning system of claim 17, wherein the concave front surface of the first wafer clamp is a V-shaped surface and the drainage hole intersects a deepest part of the V-shaped surface.

19. The wafer cleaning system of claim 17, wherein the front opening is a circle whose diameter is greater than 1.5 times a thickness of the wafer.

20. The wafer cleaning system of claim 17, wherein the plurality of one-piece wafer clamps comprises four, five, six, or eight one-piece wafer clamps evenly distributed along and on an entire circumferential edge of the supporting base for holding the outer edge of the wafer.

* * * * *